(12) United States Patent
Hwang (10) Patent No.: US 12,164,778 B2
(45) Date of Patent: Dec. 10, 2024

(54) ELECTRONIC DEVICE FOR EMULATING EEPROM AND METHOD OF OPERATING THE SAME

(71) Applicant: HYUNDAI AUTOEVER CORP., Seoul (KR)

(72) Inventor: Seong-Seo Hwang, Ansan-si (KR)

(73) Assignee: HYUNDAI AUTOEVER CORP., Seoul (KR)

( * ) Notice: Subject to any disclaimer, the term of this patent is extended or adjusted under 35 U.S.C. 154(b) by 63 days.

(21) Appl. No.: 18/075,890

(22) Filed: Dec. 6, 2022

(65) Prior Publication Data

US 2023/0176745 A1    Jun. 8, 2023

(30) Foreign Application Priority Data

Dec. 8, 2021  (KR) .......... 10-2021-0174387

(51) Int. Cl.
*G06F 3/06* (2006.01)

(52) U.S. Cl.
CPC ............ *G06F 3/0616* (2013.01); *G06F 3/064* (2013.01); *G06F 3/0679* (2013.01)

(58) Field of Classification Search
CPC .... G06F 3/0625; G06F 3/0653; G06F 3/0679; G06F 3/0664
See application file for complete search history.

(56) References Cited

U.S. PATENT DOCUMENTS

| 5,592,667 | A | * | 1/1997 | Bugajski | ............. | H03M 7/3084 |
|---|---|---|---|---|---|---|
|  |  |  |  |  |  | 707/999.102 |
| 2005/0055496 | A1 | * | 3/2005 | Nallapa | .................. | G11C 16/16 |
|  |  |  |  |  |  | 711/103 |
| 2010/0250875 | A1 | * | 9/2010 | Leung | .................. | G11C 16/102 |
|  |  |  |  |  |  | 711/155 |
| 2012/0204078 | A1 | * | 8/2012 | Hall | .................... | G06F 12/0246 |
|  |  |  |  |  |  | 711/E12.008 |

FOREIGN PATENT DOCUMENTS

KR         101826778 B1 *  3/2018
KR       20210076676 A    6/2021

* cited by examiner

*Primary Examiner* — Eric Cardwell (74) *Attorney, Agent, or Firm* — Lempia Summerfield Katz LLC (57) ABSTRACT

An electronic device for emulating an EEPROM includes: a flash ROM including a data block including a plurality of first sectors in which usage data is stored and a metadata block including a plurality of second sectors in which metadata on the usage data is stored, a virtual EEPROM emulated by the flash ROM, and a processor accessible to the flash ROM.

11 Claims, 13 Drawing Sheets

FIG. 8F

ELECTRONIC DEVICE FOR EMULATING EEPROM AND METHOD OF OPERATING THE SAME

CROSS-REFERENCE TO RELATED APPLICATION

This application claims priority to and the benefit of Korean Patent Application No. 10-2021-0174387, filed on Dec. 8, 2021, the entire contents of which are incorporated herein by reference.

FIELD

The present disclosure relates to an electronic device for emulating an electrically erasable programmable read-only memory (EEPROM), and more particularly, to an electronic device for emulating an EEPROM, which may emulate the EEPROM through a flash read-only memory (ROM), and a method of operating the same.

BACKGROUND

The statements in this section merely provide background information related to the present disclosure and may not constitute prior art.

EEPROMs are a type of non-volatile memory device and a device useful as a memory for storing setting values. Such a EEPROM memorizes contents for a relatively long time once the contents are stored and mainly just reads and uses the contents, or backs up important data which should be not erased even when power is cut off.

In general vehicles, failure/diagnosis/learning data are stored in the EEPROM built into the vehicle, causes of the failure are identified using the data stored in the EEPROM, and the vehicle is controlled to travel in an optimal state.

SUMMARY

Various embodiments of the present disclosure are directed to providing an electronic device for emulating an EEPROM, which may emulate the EEPROM through a flash ROM, and a method of operating the same.

In one aspect of the present disclosure, an electronic device for emulating an EEPROM includes a flash ROM including a data block including a plurality of first sectors in which usage data is stored, and a metadata block including a plurality of second sectors in which metadata on the usage data is stored. The electronic device further includes: a virtual EEPROM emulated by the flash ROM, and a processor accessible to the flash ROM.

In an embodiment, the virtual EEPROM may include a plurality of third sectors, and a size of the third sectors may be formed to be the same as a size of the first sectors.

In an embodiment, the metadata may be a data structure in a form in which a node indicating an index of the first sector in which usage data which is currently being stored or was previously stored in the third sector is actually stored is disposed in a plurality of layers formed to correspond to an index of the third sector.

In an embodiment, the processor may be configured to: receive a change command for the usage data stored in the third sector, store usage data corresponding to the change command in the data block, and store metadata on the usage data stored in the data block in the metadata block.

In an embodiment, the processor may be configured to: identify first sectors in which the usage data is not stored among the plurality of first sectors included in the data block, and store the usage data corresponding to the change command in a first sector having the lowest index among the identified first sectors.

In an embodiment, the processor may be configured to: identify the latest metadata among the metadata stored in the metadata block, update the identified metadata, identify second sectors in which the metadata is not stored among the plurality of second sectors included in the metadata block, and store the updated metadata in a second sector having the lowest index among the identified second sectors.

In an embodiment, the processor may be configured to: update the identified metadata by identifying an index of a third sector which is a target of the change command, identify a layer corresponding to the identified index of the third sector among layers included in the identified metadata, and add a node indicating the index of the first sector in which the usage data corresponding to the change command is stored to the rightmost side of the identified layer.

In another embodiment, a method of operating an electronic device for emulating an EEPROM is disclosed. The electronic device includes: a flash ROM including a data block including a plurality of first sectors in which usage data is stored and a metadata block including a plurality of second sectors in which metadata on the usage data is stored, a virtual EEPROM emulated by the flash ROM, and a processor accessible to the flash ROM. In particular, the method includes: receiving a change command for usage data stored in the virtual EEPROM, storing usage data corresponding to the change command in the data block, and storing metadata on the usage data stored in the data block in the metadata block according to the change command.

In an embodiment, the virtual EEPROM may include a plurality of third sectors, and a size of the third sectors may be formed to be the same as a size of the first sectors.

In an embodiment, the metadata may be a data structure in a form in which a node indicating an index of the first sector in which usage data which is currently being stored or was previously stored in the third sector is actually stored is disposed in a plurality of layers formed to correspond to an index of the third sector.

In an embodiment, the storing of the usage data in the data block may include: identifying first sectors in which the usage data is not stored among the plurality of first sectors included in the data block and storing usage data corresponding to the change command in a first sector having the lowest index among the identified first sectors.

In an embodiment, the storing of the metadata in the metadata block may include: identifying the latest metadata among the metadata stored in the metadata block, updating the identified metadata, identifying second sectors in which the metadata is not stored among the plurality of second sectors included in the metadata block, and storing the updated metadata in a second sector having the lowest index among the identified second sectors.

In an embodiment, the updating of the identified metadata may include: identifying an index of a third sector which is a target of the change command, identifying a layer corresponding to the identified index of the third sector among layers included in the identified metadata, and adding a node indicating an index of a first sector in which usage data corresponding to the change command is stored to the rightmost side of the identified layer.

According to one aspect of the present disclosure, it is possible to implement a virtual EEPROM by emulating an EEPROM through a flash ROM, ensure the equal use of the entire flash ROM in a process of emulating the EEPROM through the flash ROM, and provide the traceability of data previously stored in the EEPROM emulated through the flash ROM.

BRIEF DESCRIPTION OF THE DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

Hereinafter, an electronic device for emulating an electrically erasable programmable read-only memory (EEPROM) and a method of operating the same according to an embodiment of the present disclosure are described in detail with reference to the accompanying drawings. In the present disclosure, the thicknesses of the lines or the sizes of the components shown in the drawings may be exaggeratedly shown for clarity and convenience of description. In addition, the terms to be described below are terms defined in consideration of the functions in the present disclosure, which may vary according to intentions or customs of users and operators. Therefore, the terms should be defined based on the contents throughout the specification.

When a component, device, element, or the like of the present disclosure is described as having a purpose or performing an operation, function, or the like, the component, device, or element should be considered herein as being "configured to" meet that purpose or to perform that operation or function.

Figure 1:
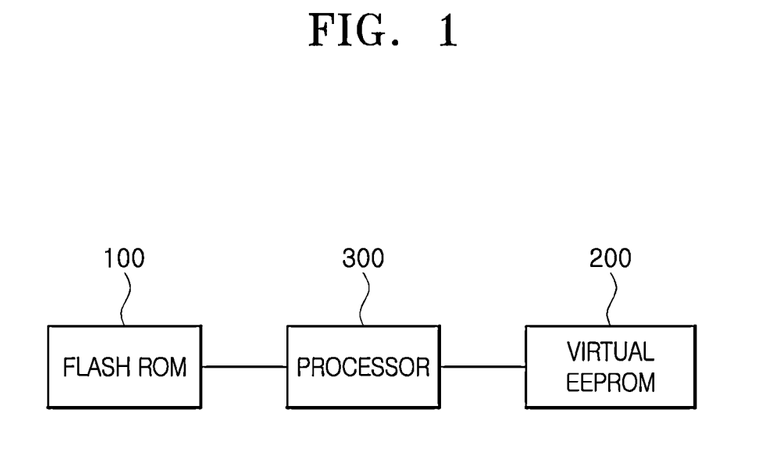
FIG. 1 is a block diagram illustrating an electronic device for emulating an EEPROM according to one embodiment of the present disclosure.
Figure 2:
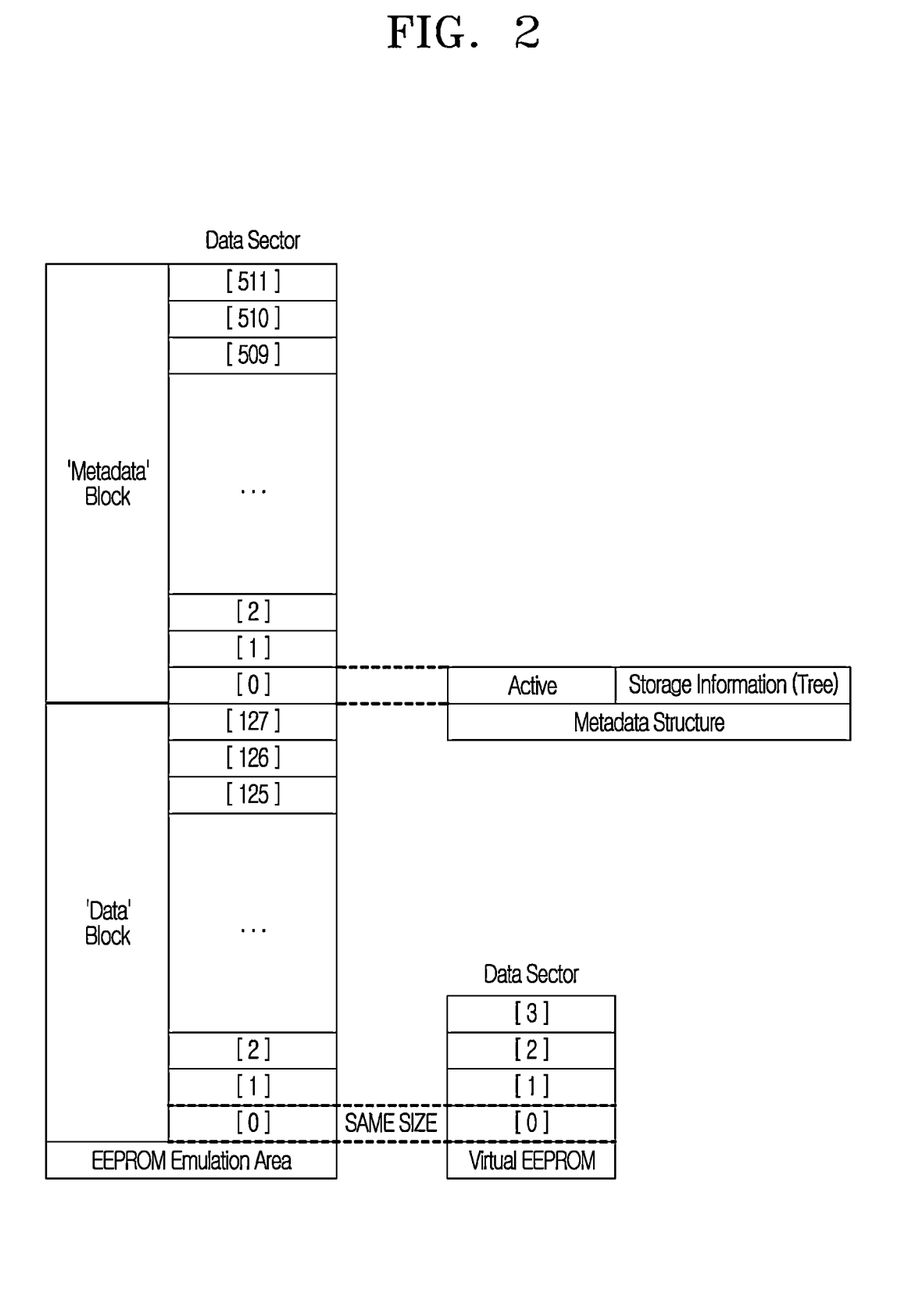
FIGS. 2 and 3 are views describing the electronic device for emulating the EEPROM according to one embodiment of the present disclosure.
Figure 3:
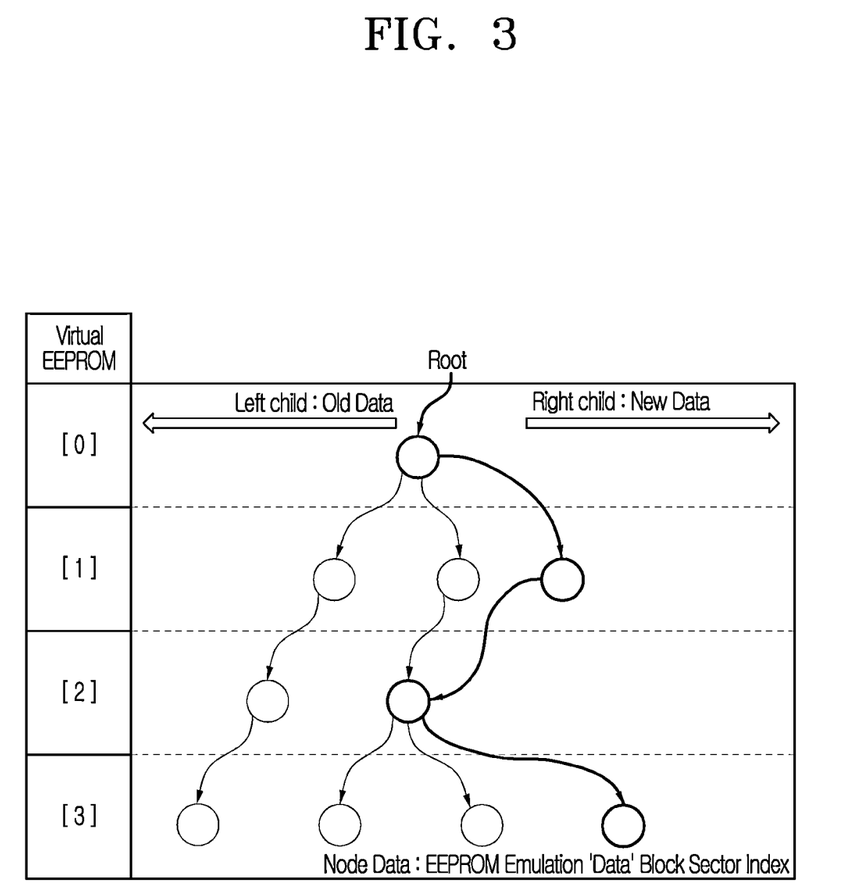

FIG. 1 is a block diagram showing an electronic device for emulating an EEPROM according to one embodiment of the present disclosure, and FIGS. 2 and 3 are exemplary views for describing the electronic device for emulating the EEPROM according to one embodiment of the present disclosure.

Referring to FIG. 1, an electronic device for emulating an EEPROM according to one embodiment of the present disclosure may include a flash ROM 100, a virtual EEPROM 200, and a processor 300.

FIG. 2 shows one embodiment of a structure of the flash ROM 100. Referring to FIG. 2, the flash ROM 100 may include: a data block including a plurality of first sectors in which usage data is stored, and a metadata block including a plurality of second sectors in which metadata on the usage data is stored.

The data block is an area in which the usage data is stored and may include the plurality of first sectors in which the usage data may be stored. Sizes of the respective first sectors included in the data block may be the same as each other. In other words, the data block may be divided into sectors having a constant size. An index corresponding to an identification number for identifying a corresponding sector may be assigned to each first sector, and the index may be an address value of the corresponding sector. The index may also be assigned to each sector included in the metadata block and the virtual EEPROM 200, which are described below.

The metadata block is an area in which the metadata on the usage data is stored and may include the plurality of second sectors in which the metadata may be stored. Sizes of the respective second sectors included in the metadata block may be the same as each other. In other words, the metadata block may be divided into sectors having a constant size. An index corresponding to an identification number for identifying a corresponding sector may be assigned to each second sector, and active data providing information on whether the metadata is stored in the corresponding second sector may also be stored in the second sector.

The virtual EEPROM 200 is a virtual storage space emulated by the flash ROM 100 and may include a plurality of third sectors. Sizes of the respective third sectors included in the virtual EEPROM 200 may be the same as each other. In addition, the size of the third sector included in the virtual EEPROM 200 may be the same as the size of the first sector included in the data block. The number of third sectors included in the virtual EEPROM 200 may be set to be smaller than the number of first sectors included in the data block.

The metadata may be mapping data for mapping some of the plurality of first sectors included in the data block to the plurality of third sectors included in the virtual EEPROM 200. In other words, the metadata is information for indicating the first sector used as the storage space of the virtual EEPROM 200 among the plurality of first sectors included in the data block and may include information on the index of the first sector in which the usage data stored in each third sector included in the virtual EEPROM 200 is actually stored. The metadata may be in the form of a data structure.

The metadata may be a data structure in a form in which a node indicating the index of the first sector in which usage data which is currently being stored or was previously stored in the third sector is actually stored is disposed in a plurality of layers formed to correspond to an index of the third sector. In other words, a node indicating an index of a first sector in which usage data which is currently being stored or was previously stored in a third sector having an index N is actually stored may be disposed in a layer N.

The metadata may have the form of a kind of a tree structure, and when the metadata is described as having the tree structure, the number of third sectors included in the virtual EEPROM 200 may correspond to a depth, the index of the third sector may correspond to a level, and the index in which the usage data which is currently being stored or was previously stored in the third sector is actually stored may correspond to a node.

FIG. 3 shows one embodiment of a metadata structure. Referring to FIG. 3, when four third sectors included in the metadata are provided, a total of four layers may be present, and an index of a first sector in which usage data which is currently being stored or was previously stored in the third sector having an index 0 is actually stored may be disposed in a layer 0 as a node. Likewise, an index of a first sector in which usage data which is currently being stored or was previously stored in the third sector having an index 1 is actually stored may be disposed in a layer 1 as a node.

Meanwhile, each node may be disposed according to the order in which the usage data indicated by the node is stored in the third sector. For example, a node indicating usage data stored earlier in the third sector may be disposed at a left of the layer, and a node indicating the usage data stored later in the third sector may be disposed at a right of the layer. Referring to FIG. 3, a node positioned on a rightmost side among nodes disposed in a layer 3 may be a node indicating usage data which is currently being stored in a third sector having an index 3, and a node positioned on a leftmost side among the nodes disposed in the layer 3 may be a node indicating usage data initially stored in the third sector having the index 3.

The processor 300 may receive a change command for the usage data stored in the third sector included in the virtual EEPROM 200. The change command may include information on the third sector to be changed and information on usage data to be newly stored in the third sector to be changed. The processor 300 may include an interface for receiving the change command.

The processor 300 may store usage data corresponding to the change command in the data block. According to one embodiment, the processor 300 may identify first sectors in which usage data is not stored among the plurality of first sectors included in the data block and store the usage data corresponding to the change command in a first sector having the lowest index among the identified first sectors. In other words, when the usage data stored in the virtual EEPROM 200 is changed, the processor 300 may sequentially store the changed usage data in the data block of the flash ROM 100.

The processor 300 may store metadata on the usage data stored in the data block in the metadata block according to the change command. Specifically, the processor 300 may identify the latest metadata among the metadata stored in the metadata block, update the previously identified metadata by reflecting a changed item, identify second sectors in which the metadata is not stored among the plurality of second sectors included in the metadata block, and store the updated metadata in the second sector having the lowest index among the identified second sectors. In other words, when the usage data stored in the virtual EEPROM 200 is changed, the processor 300 may update the metadata by reflecting the changed item and sequentially store the updated metadata in the metadata block. The above-described process may be applied in the same manner even when the usage data is first input to the third sector.

The processor 300 may identify an index of a third sector which is a target of the change command, identify a layer corresponding to the identified index of the third sector among the layers included in the metadata, and add a node indicating an index of a first sector in which the usage data corresponding to the change command is stored to a rightmost side of the previously identified layer. In other words, the processor 300 may update the metadata by additionally arranging the node indicating the index of the first sector in which the changed usage data is actually stored to the right of a current node positioned in the layer corresponding to the changed third sector.

As described above, the embodiment may provide the traceability of the past usage data stored in the virtual EEPROM 200 by constituting the metadata in a form in which the added node is disposed at the right of the current node. In other words, the processor 300 may track not only the usage data which is currently being stored in the virtual EEPROM 200, but also the usage data which was previously stored in the virtual EEPROM 200 by analyzing the tree structure. In other words, the processor 300 may identify the node positioned on the rightmost side among the nodes disposed in the layer included in the metadata with an address (i.e., the index of the first sector) of the usage data which is currently being stored in the third sector corresponding to a corresponding level and identify a node positioned at the left thereof with an address of the usage data which was previously stored in the corresponding third sector.

Meanwhile, in the embodiment, when the usage data is stored in the data block or the metadata is stored in the metadata block, it is possible to provide the equal use of the entire flash ROM 100 by sequentially storing the usage data or the metadata in the data block or the metadata block. In other words, in the embodiment, when data is changed, it is possible to inhibit or prevent the data from being repeatedly recorded in only a specific area of the flash ROM 100 by storing the changed data in an empty space of the flash ROM 100 without modifying the corresponding data, and the entire flash ROM 100 can be equally used.

Meanwhile, the processor 300 may initialize the flash ROM 100 when the usage data is stored in all first sectors included in the data block or the metadata is stored in all second sectors included in the metadata block. At this time, only the usage data stored in the virtual EEPROM 200 is stored in a buffer just before initialization, and then after initialization, the usage data stored in the buffer may also be stored in the data block.

Figure 4:
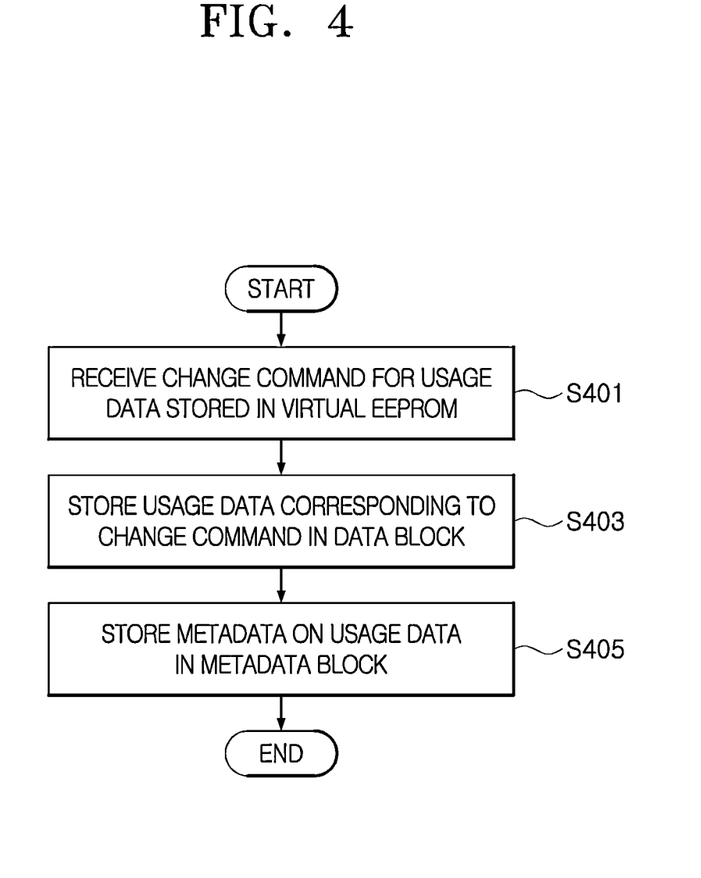
FIGS. 4 to 7 are flowcharts for describing a method of operating the electronic device for emulating the EEPROM according to one embodiment of the present disclosure.

FIG. 4 is a first flowchart for describing a method of operating an electronic device for emulating an EEPROM according to one embodiment of the present disclosure, and referring to FIG. 4, first, the processor 300 receives the change command for the usage data stored in the virtual EEPROM 200 (S401).

When receiving the change command, the processor 300 stores the usage data corresponding to the change command in the data block (S403). A specific method of storing the usage data corresponding to the change command in the data block by the processor 300 is described below.

Subsequently, the processor 300 stores the metadata on the usage data stored in the metadata block according to the change command (S405). A specific method for storing the metadata on the usage data stored in the metadata block according to the change command by the processor 300 is described below.

Figure 5:
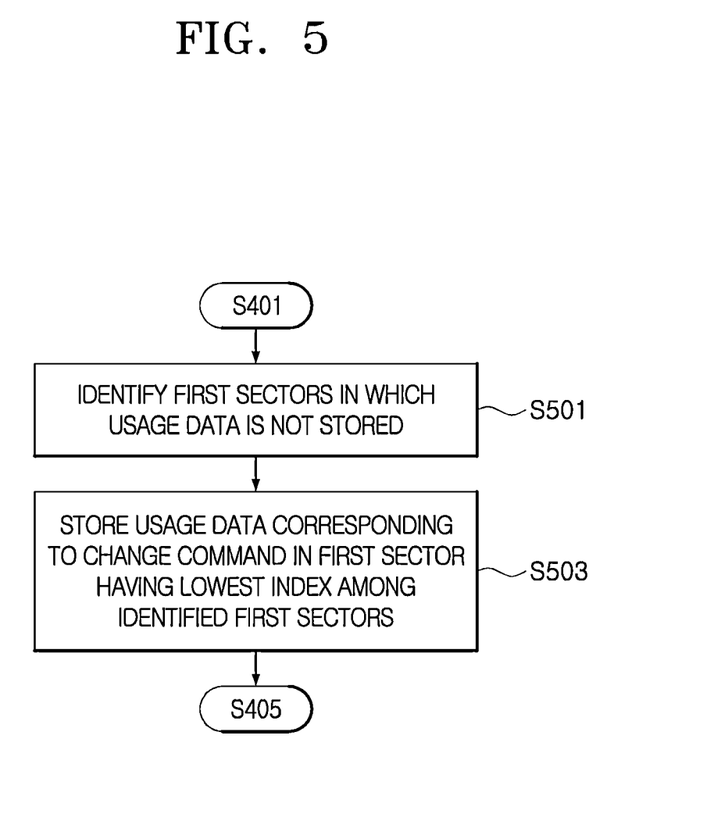

FIG. 5 is a second flowchart for describing the method of operating the electronic device for emulating the EEPROM according to one embodiment of the present disclosure, and a process of recording the usage data in the data block by the processor 300 is described with reference to FIG. 5.

First, the processor 300 identifies first sectors in which the usage data is not stored among the plurality of first sectors (S501).

Subsequently, the processor 300 stores the usage data corresponding to the change command in the first sector having the lowest index among the identified first sectors (S503). In other words, when the usage data stored in the virtual EEPROM 200 is changed, the processor 300 may sequentially store the changed usage data in the data block of the flash ROM 100.

Figure 6:
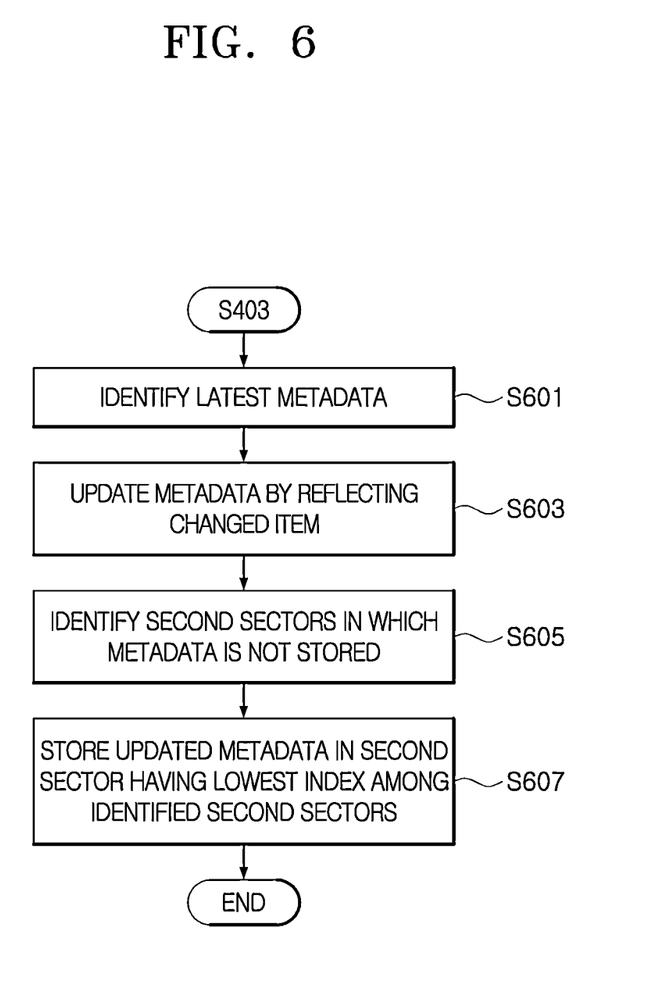

FIG. 6 is a third flowchart for describing the method of operating the electronic device for emulating the EEPROM according to one embodiment of the present disclosure, and a process of recording the metadata in the metadata block by the processor 300 is described with reference to FIG. 6.

First, the processor 300 identifies the latest metadata among the metadata stored in the metadata block (S601).

The processor 300 may identify metadata stored in a sector having the highest index among the second sectors in which the metadata is stored as the latest metadata.

Subsequently, the processor 300 updates the metadata by reflecting the changed item (S603). A specific method of updating the metadata by the processor 300 is described below.

Subsequently, the processor 300 identifies the second sectors in which the metadata is not stored among the plurality of second sectors included in the metadata block (S605). The processor 300 may identify the second sectors in which the metadata is not stored among the plurality of second sectors included in the metadata block based on active data.

Subsequently, the processor 300 stores the updated metadata in the second sector having the lowest index among the identified second sectors (S607). In other words, when the metadata is updated as the usage data stored in the virtual EEPROM 200 is changed, the processor 300 may sequentially store the updated metadata in the metadata block of the flash ROM 100.

Figure 7:
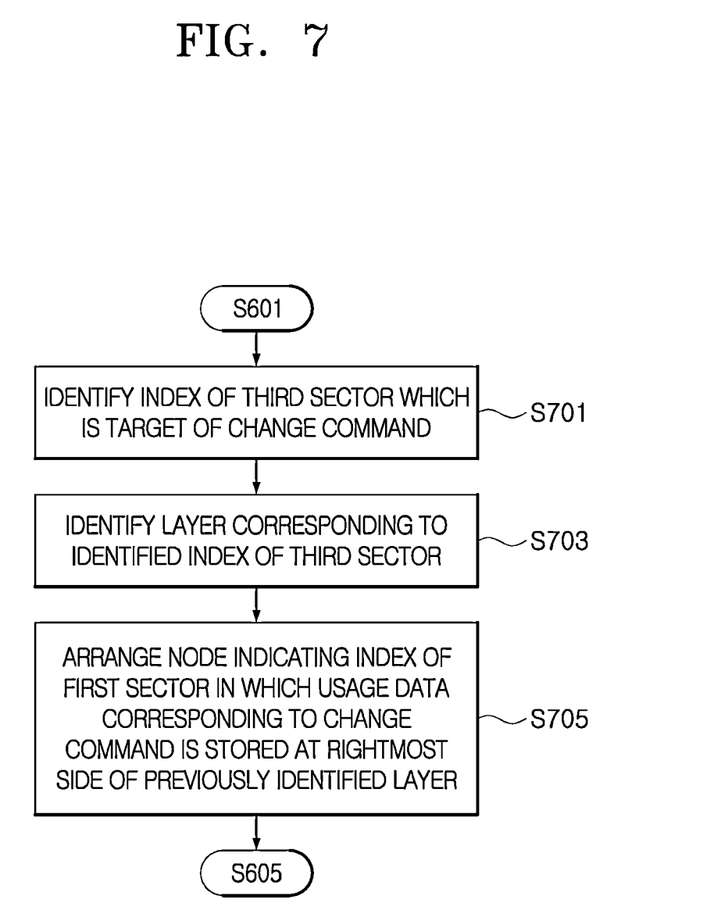

FIG. 7 is a fourth flowchart for describing the method of operating the electronic device for emulating the EEPROM according to one embodiment of the present disclosure, and a process of updating the metadata by the processor 300 is described with reference to FIG. 7.

First, the processor 300 identifies the index of the third sector which is a target of the change command (S701). The processor 300 may identify the index of the third sector which is the target of the change command with reference to the change command.

Subsequently, the processor 300 identifies the layer corresponding to the identified index of the third sector among the layers included in the metadata (S703).

Subsequently, the processor 300 adds the node indicating the index of the first sector in which the usage data corresponding to the change command is stored to the rightmost side of the previously identified layer (S705). In other words, the processor 300 may update the metadata by additionally arranging the node indicating the index of the first sector in which the changed usage data is actually stored at the right of the current node positioned in the layer corresponding to the changed third sector.

FIG. 8 is a view illustrating the method of operating the electronic device for emulating the EEPROM according to one embodiment of the present disclosure, and one embodiment in which the EEPROM is emulated is described with reference to FIG. 8.

Figure 8A:
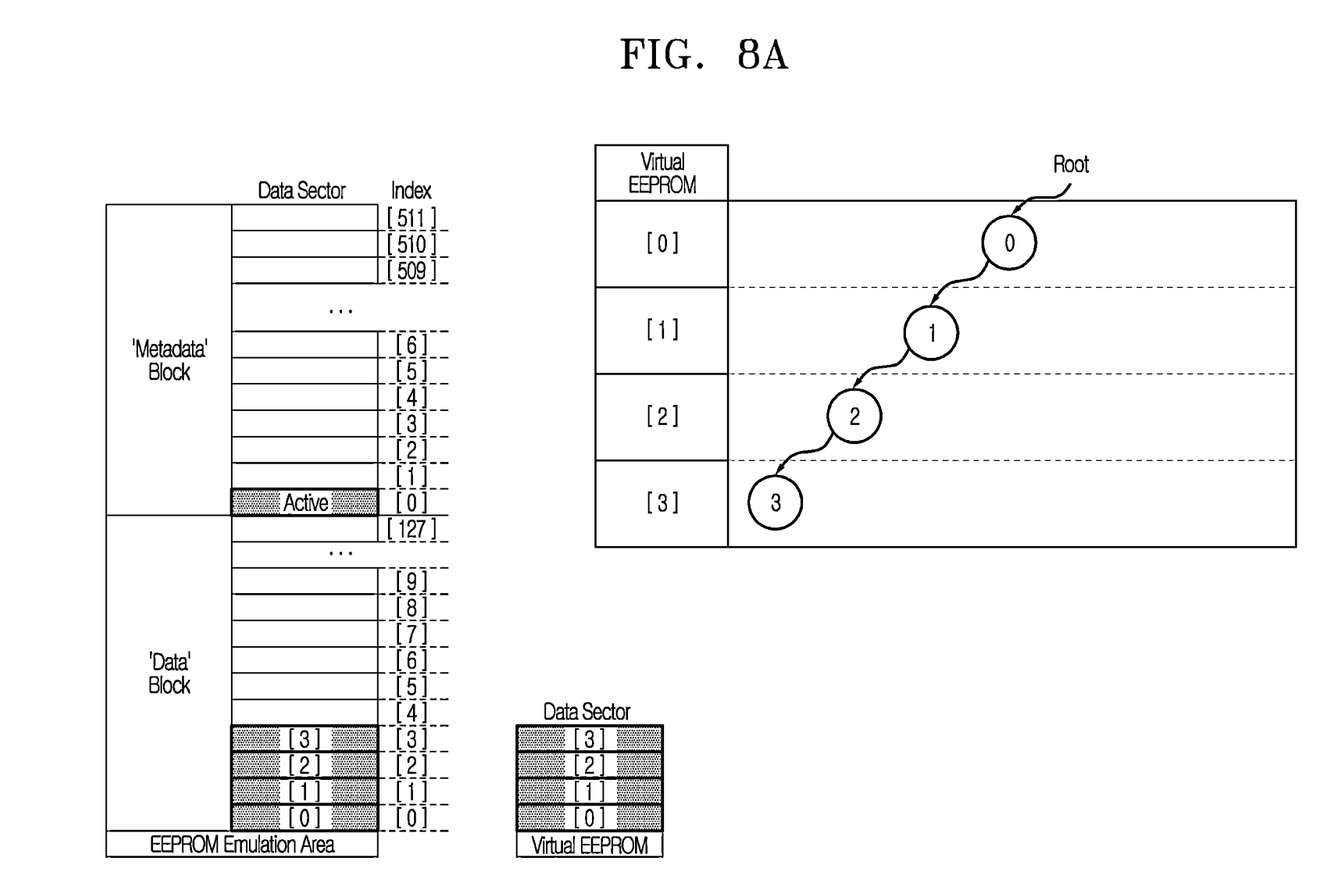
FIGS. 8A-8F are views describing the method of operating the electronic device for emulating the EEPROM according to one embodiment of the present disclosure.

FIG. 8A shows a case in which the usage data is initially stored in the virtual EEPROM 200 including four third sectors. In this case, usage data from a third sector having an index zero "0" to a third sector having an index 3 may be actually stored in from a first sector having an index zero "0" to a first sector having an index 3 included in the data block. Meanwhile, metadata indicating that the usage data from the third sector having the index zero "0" to the third sector having the index 3 are stored in from the first sector having the index zero "0" to the first sector having the index 3 may be stored in a second sector having an index zero "0" included in the metadata block in the form of a data structure.

Figure 8B:
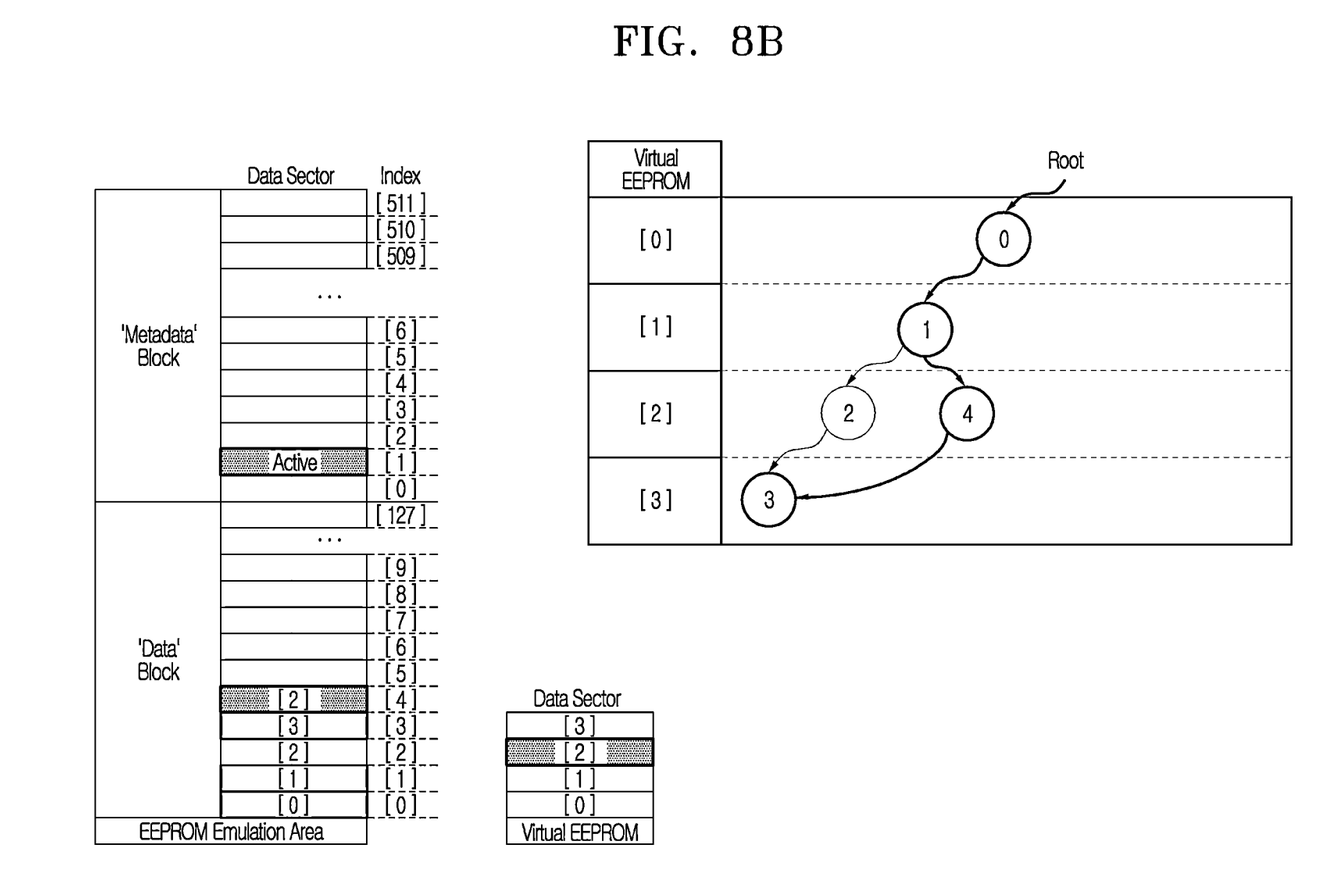

FIG. 8B shows a case in which a change command for the usage data stored in the third sector having the index 2 is input in the state of FIG. 8A. In this case, the processor 300 first stores the usage data corresponding to the change command in a first sector having an index 4. Subsequently, the processor 300 updates the metadata by adding a node indicating the index (i.e., the index 4) of the first sector in which the usage data is previously stored to the rightmost side of a layer 2 which is a layer corresponding to the third sector having the index 2 among the layers of the metadata. Subsequently, the processor 300 stores the updated metadata in a second sector having an index 1.

Figure 8C:
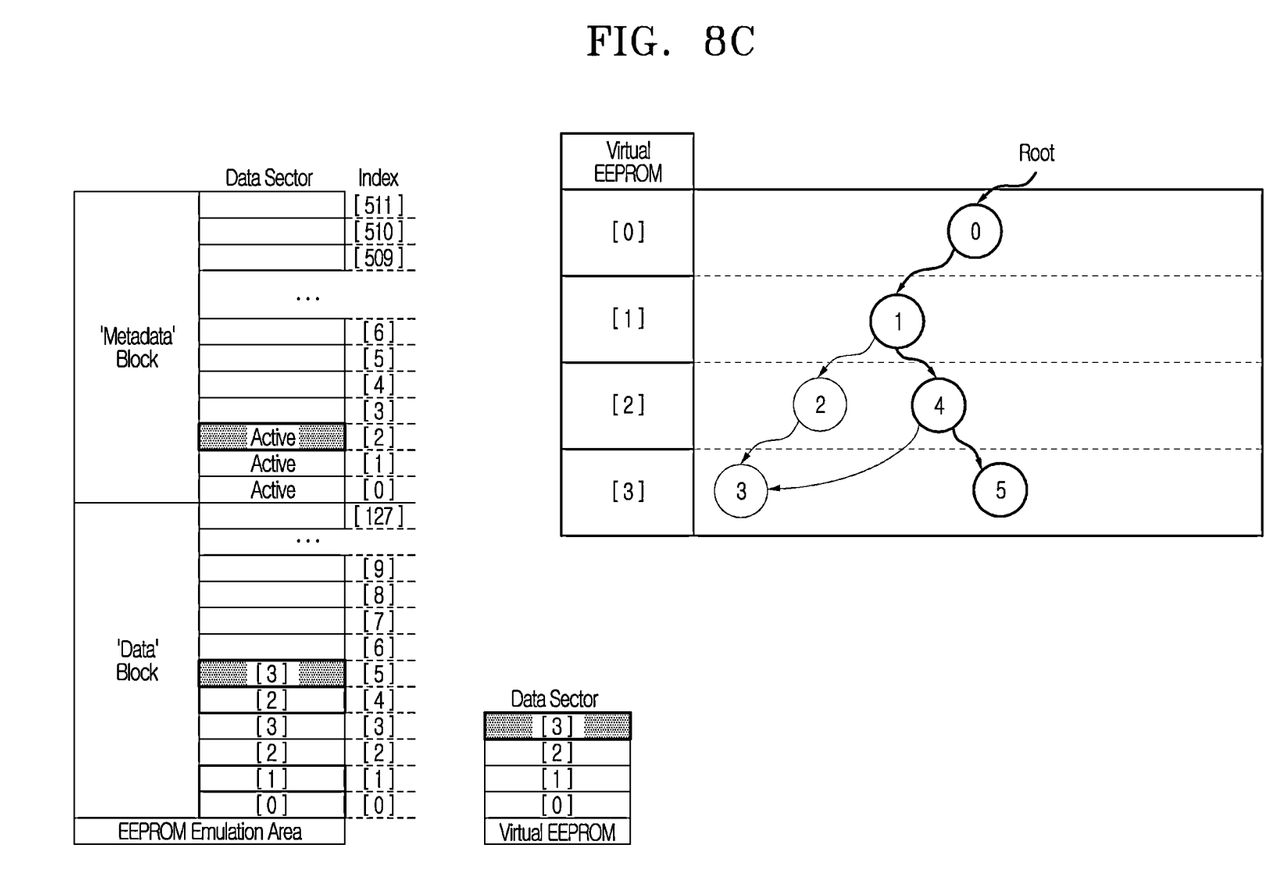

FIG. 8C shows a case in which a change command for the usage data stored in the third sector having the index 3 is input in the state of FIG. 8B. In this case, first, the processor 300 stores the usage data corresponding to the change command in a first sector having an index 5. Subsequently, the processor 300 updates the metadata by adding a node indicating the index (i.e., the index 5) of the first sector in which the usage data is previously stored to the rightmost side of a layer 3 which is a layer corresponding to the third sector having the index 3 among the layers of the metadata. Subsequently, the processor 300 stores the updated metadata in a second sector having an index 2.

Figure 8D:
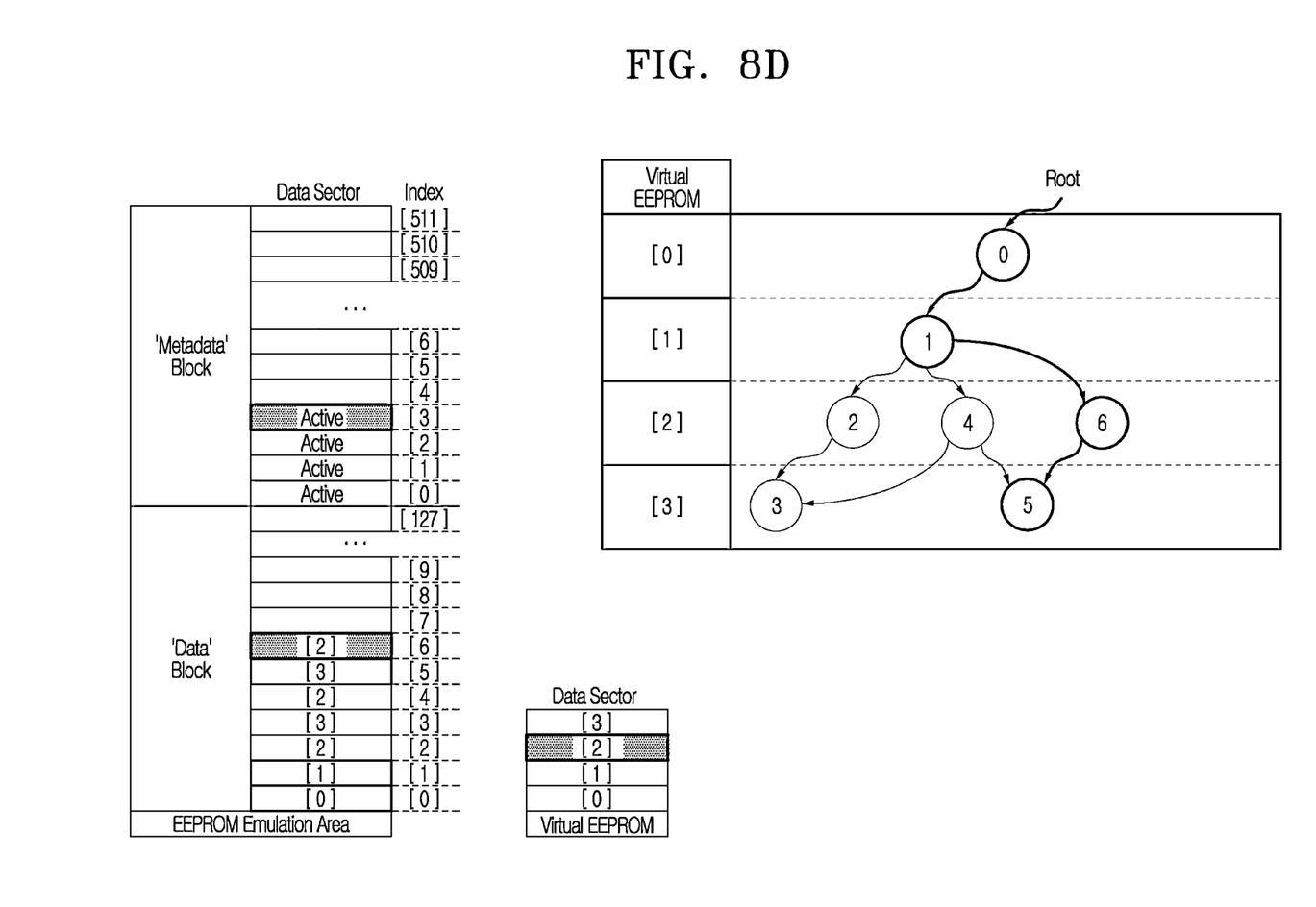

FIG. 8D shows a case in which the change command for the usage data stored in the third sector having the index 2 is re-input in the state of FIG. 8C. In this case, the processor 300 first stores the usage data corresponding to the change command in a first sector having an index 6. Subsequently, the processor 300 updates the metadata by adding a node indicating the index (i.e., the index 6) of the first sector in which the usage data is previously stored to the rightmost side of the layer 2 which is a layer corresponding to the third sector having the index 2 among the layers of the metadata. Subsequently, the processor 300 stores the updated metadata in a second sector having an index 3.

Figure 8E:
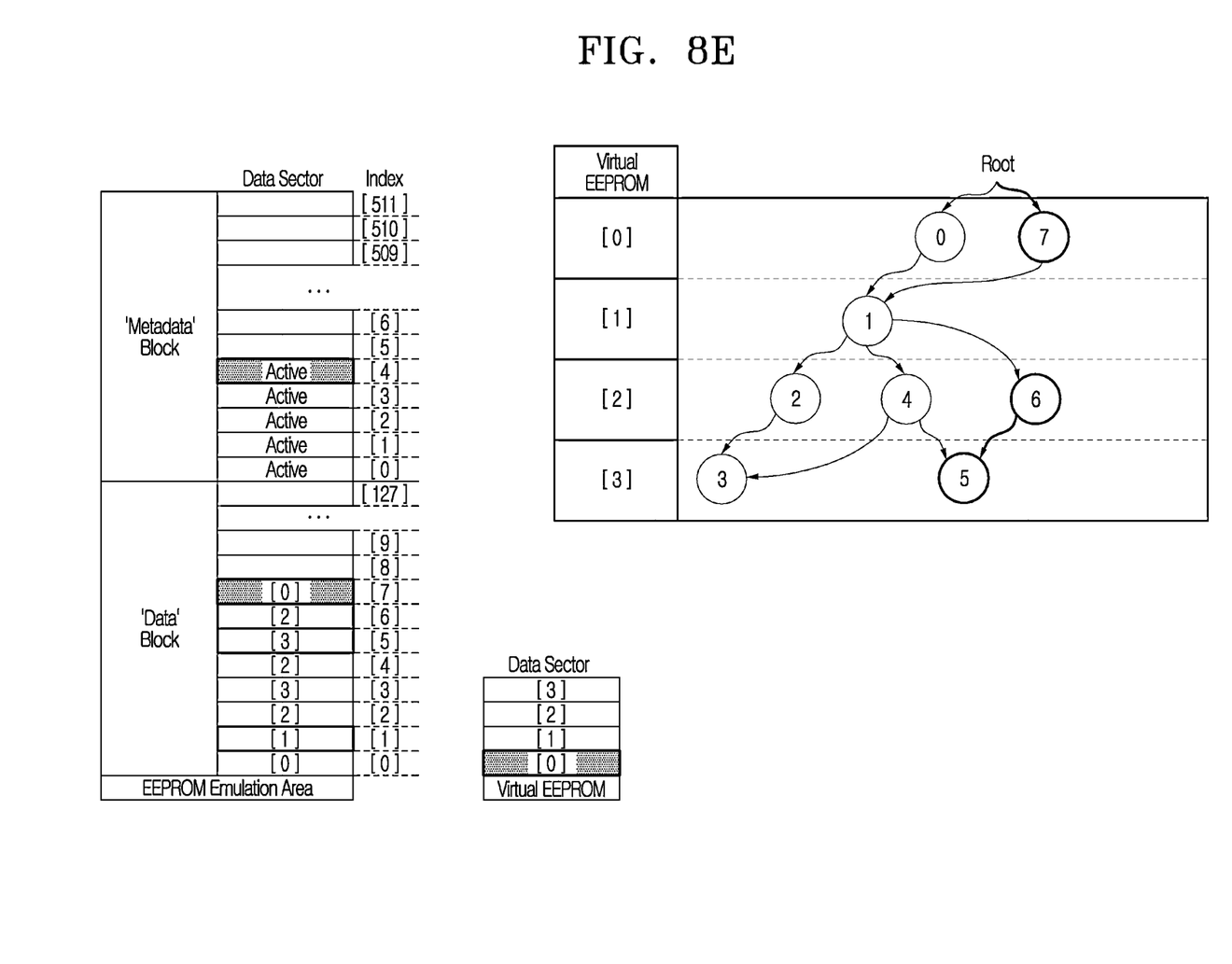

FIG. 8E shows a case in which a change command for the usage data stored in the third sector having the index 0 is input in the state of FIG. 8D. In this case, the processor 300 first stores the usage data corresponding to the change command in a first sector having an index 7. Subsequently, the processor 300 updates the metadata by adding a node indicating the index (i.e., the index 7) of the first sector in which the usage data is previously stored to the rightmost side of a layer 0 which is a layer corresponding to the third sector having the index 0 among the layers of the metadata. Subsequently, the processor 300 stores the updated metadata in a second sector having an index 4.

Figure 8F:
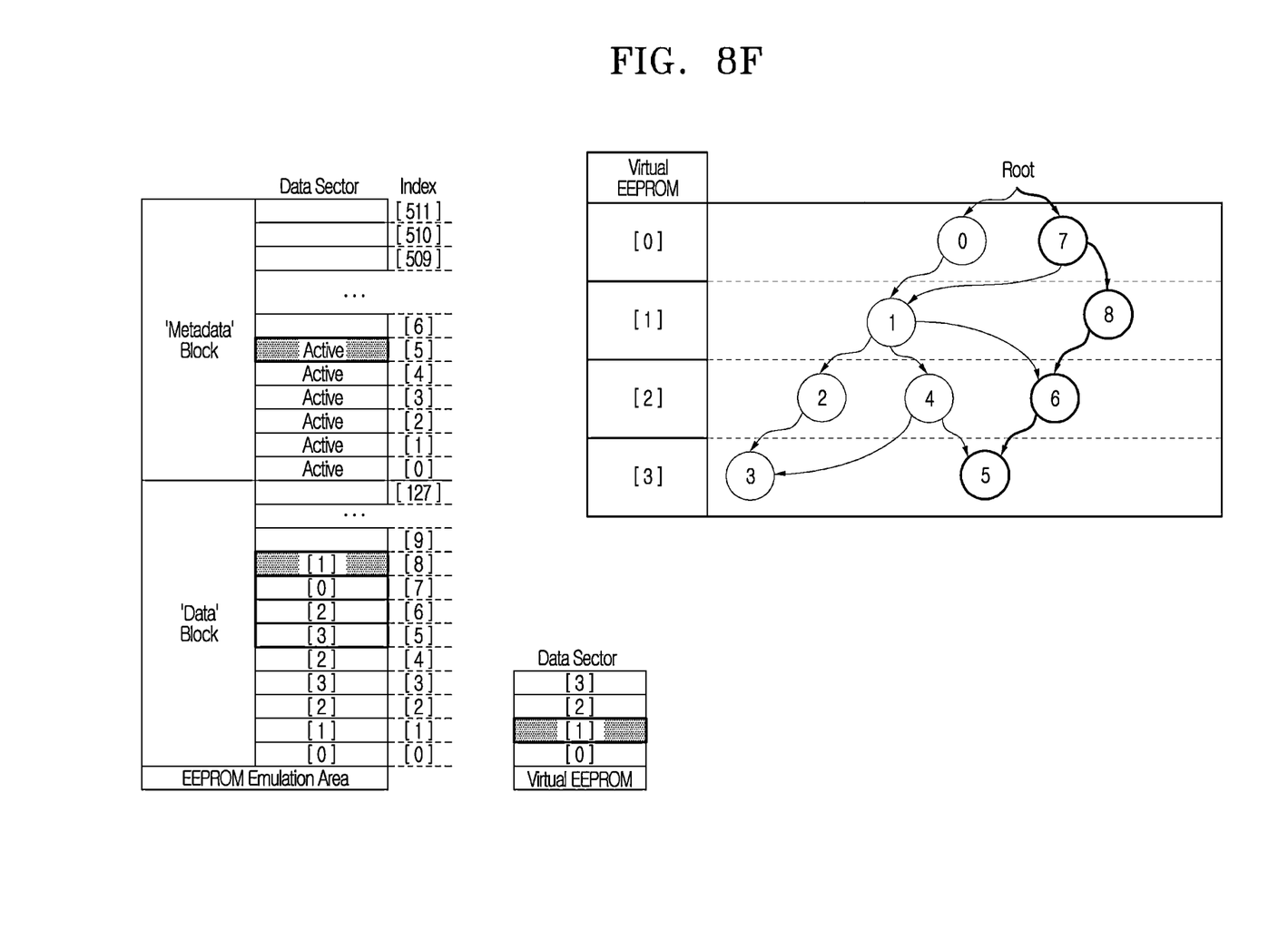

FIG. 8F shows a case in which a change command for the usage data stored in the third sector having the index 1 is input in the state of FIG. 8E. In this case, the processor 300 first stores the usage data corresponding to the change command in a first sector having an index 8. Subsequently, the processor 300 updates the metadata by adding a node indicating the index (i.e., the index 8) of the first sector in which the usage data is previously stored to the rightmost side of a layer 1 which is a layer corresponding to the third sector having the index 1 among the layers of the metadata. Subsequently, the processor 300 stores the updated metadata in a second sector having an index 5.

As described above, in the embodiment, it is possible to implement the virtual EEPROM by emulating the EEPROM through the flash ROM, ensure the equal use of the entire flash ROM in the process of emulating the EEPROM through the flash ROM, and provide the traceability of the data previously stored in the EEPROM emulated through the flash ROM.

The term "module" used in the specification may include a unit implemented in hardware, software, or firmware and may be used interchangeably with a term such as a logic, a logic block, a part, or a circuit. The module may be an integrally formed part or a minimum unit or a portion of the part for performing one or more functions. For example, according to one embodiment, the module may be implemented in the form of an application-specific integrated circuit (ASIC). Further, the implementations described in the specification may be made by, for example, a method or process, an apparatus, a software program, a data stream, or a signal. Although discussed only in the context of a single form of implementation (e.g., discussed only as a method), the implementations of the discussed features may also be made in other forms (e.g., an apparatus or program). The apparatus may be implemented as suitable hardware, software, firmware, and the like. The method may be implemented by an apparatus such as a processor which generally refers to a processing device including, for example, a computer, a microprocessor, an integrated circuit, or a programmable logic device. The processor may also include communication devices such as a computer, a cell phone, a portable/personal digital assistant ("PDA"), and other devices, which facilitate communication of information between end-users.

Although the present disclosure has been described with reference to some embodiments shown in the drawings, those having ordinary skill in the art to which the relevant technology pertains should understand that this is only illustrative and various modifications and other embodiments equivalent thereto are possible. Therefore, the true technical scope of the present disclosure should be defined by the appended claims.

What is claimed is:

1. An electronic device for emulating an electrically erasable programmable read-only memory (EEPROM), the electronic device comprising:
    a flash read-only memory (ROM) including: a data block including a plurality of first sectors in which usage data is stored, and a metadata block including a plurality of second sectors in which metadata on the usage data is stored, wherein the usage data is a data used for operation of a vehicle into which the electronic device is built;
    a virtual EEPROM emulated by the flash ROM, wherein the virtual EEPROM includes a plurality of third sectors; and
    a processor configured to access the flash ROM,
    wherein the metadata is a data structure in a form in which a node indicating an index of a first sector, among the plurality of first sectors, that actually stores usage data that is currently stored or was previously stored in a third sector among the plurality of third sectors, wherein the node is disposed in a layer among a plurality of layers formed to correspond to indices of the third sectors.

2. The electronic device of claim 1, wherein a size of the plurality of third sectors is the same as a size of the plurality of first sectors.

3. The electronic device of claim 1, wherein the processor is configured to:
    receive a change command for the usage data stored in a third sector among the plurality of third sectors,
    store usage data corresponding to the change command in the data block, and
    store metadata, on the usage data stored in the data block, in the metadata block.

4. The electronic device of claim 3, wherein the processor is configured to:
    identify, among the plurality of first sectors included in the data block, first sectors in which the usage data is not stored, and
    store the usage data corresponding to the change command in a first sector having a lowest index among the identified first sectors.

5. The electronic device of claim 3, wherein the processor is configured to:
    identify a latest metadata among the metadata stored in the metadata block,
    update the identified metadata,
    identify, among the plurality of second sectors included in the metadata block, second sectors in which the metadata is not stored, and
    store the updated metadata in a second sector having a lowest index among the identified second sectors.

6. The electronic device of claim 5, wherein the processor is configured to:
    update the identified metadata by identifying an index of a third sector which is a target of the change command,
    identify a layer corresponding to the identified index of the third sector among layers included in the identified metadata, and
    add a node indicating an index of a first sector in which the usage data corresponding to the change command is stored to a rightmost side of the identified layer.

7. A method of operating an electronic device for emulating an electrically erasable programmable read-only memory (EEPROM), wherein the electronic device includes: a flash ROM including a data block including a plurality of first sectors in which usage data is stored and a metadata block including a plurality of second sectors in which metadata on the usage data is stored, wherein the usage data is a data used for operation of a vehicle into which the electronic device is built; a virtual EEPROM emulated by the flash ROM; and a processor accessible to the flash ROM, the method comprising:
    receiving a change command for usage data stored in the virtual EEPROM, wherein the virtual EEPROM includes a plurality of third sectors;
    storing usage data corresponding to the change command in the data block; and
    storing metadata on the usage data stored in the data block in the metadata block according to the change command, wherein the metadata is a data structure in a form in which a node indicating an index of a first sector, among the plurality of first sectors, that actually stores usage data that is currently stored or was previously stored in a third sector among the plurality of third sectors, wherein the node is disposed in a layer among a plurality of layers formed to correspond to indices of the third sectors.

8. The method of claim 7, a size of the plurality of third sectors is the same as a size of the plurality of first sectors.

9. The method of claim 7, wherein storing the usage data in the data block includes:
    identifying, among the plurality of first sectors included in the data block, first sectors in which the usage data is not stored; and
    storing usage data corresponding to the change command in a first sector having a lowest index among the identified first sectors.

10. The method of claim 7, wherein storing the metadata in the metadata block includes:
    identifying a latest metadata among the metadata stored in the metadata block;
    updating the identified metadata;
    identifying, among the plurality of second sectors included in the metadata block, second sectors in which the metadata is not stored; and storing the updated metadata in a second sector having a lowest index among the identified second sectors.

11. The method of claim 10, wherein updating the identified metadata includes:
   identifying an index of a third sector which is a target of the change command;
   identifying a layer corresponding to the identified index of the third sector among layers included in the identified metadata; and
   adding a node indicating an index of a first sector in which usage data corresponding to the change command is stored to a rightmost side of the identified layer.

\* \* \* \* \*